(12) United States Patent
Idgunji et al.

(10) Patent No.: US 8,830,783 B2
(45) Date of Patent: Sep. 9, 2014

(54) IMPROVING READ STABILITY OF A SEMICONDUCTOR MEMORY

(75) Inventors: Sachin Satish Idgunji, San Jose, CA (US); Hemangi Umakant Gajjewar, Sunnyvale, CA (US); Vincent Phillipe Schuppe, Austin, TX (US); Yew Keong Chong, New Braunfels, TX (US); Hsin-Yu Chen, Austin, TX (US)

(73) Assignee: ARM Limited, Cambridge (GB)

( * ) Notice: Subject to any disclaimer, the term of this patent is extended or adjusted under 35 U.S.C. 154(b) by 483 days.

(21) Appl. No.: 12/929,138

(22) Filed: Jan. 3, 2011

(65) Prior Publication Data

US 2012/0170390 A1   Jul. 5, 2012

(51) Int. Cl.
| | |
|---|---|
| *G11C 8/00* | (2006.01) |
| *G11C 11/419* | (2006.01) |
| *G11C 11/418* | (2006.01) |
| *G11C 11/41* | (2006.01) |
| *G11C 11/413* | (2006.01) |
| *G11C 8/08* | (2006.01) |
| *G11C 7/22* | (2006.01) |
| *G11C 8/10* | (2006.01) |
| *G11C 8/16* | (2006.01) |
| *G11C 11/412* | (2006.01) |

(52) U.S. Cl.
CPC ............. *G11C 7/222* (2013.01); *G11C 11/419* (2013.01); *G11C 11/418* (2013.01); *G11C 11/41* (2013.01); *G11C 11/413* (2013.01); *G11C 8/08* (2013.01); *G11C 8/10* (2013.01); *G11C 8/16* (2013.01); *G11C 11/412* (2013.01)
USPC .. 365/230.06; 365/154; 365/194; 365/189.09; 365/189.11

(58) Field of Classification Search
USPC ............ 365/154, 156, 190, 230.05, 194, 365/189.09, 189.11, 210.1, 230.06
See application file for complete search history.

(56) References Cited

U.S. PATENT DOCUMENTS

| | | | |
|---|---|---|---|
| 7,161,854 B2* | 1/2007 | Iwasaki | 365/193 |
| 7,508,698 B2* | 3/2009 | Houston | 365/154 |

(Continued)

OTHER PUBLICATIONS

S. Ohbayashi et al, "A 65-nm SoC Embedded 6T-SRAM Designed for Manufacturing With Read and Write Operation Stabilizing Circuits" *IEEE Journal of Solid-State Circuits*, vol. 42, No. 4, Apr. 2007, pp. 820-829.

(Continued)

*Primary Examiner* — Kretelia Graham
(74) *Attorney, Agent, or Firm* — Nixon & Vanderhye P.C.

(57) ABSTRACT

A semiconductor memory storage device is disclosed. The memory comprises a plurality of storage cells for storing data each storage cell comprising an access control device for providing the storage cell with access to or isolation from a data access port in response to an access control signal, access control circuitry for transmitting the access control signal along an access control line to control a plurality of the access control devices connected to the access control line. The access control circuitry responds to a data access request signal by increasing a voltage level supplied to the access control line to a first voltage level at a first average rate and then in response to receipt of a further signal increasing the voltage level supplied to the access control line to the predetermined higher voltage level, in such a way that a further average rate of increase of the voltage level from the first to the predetermined higher voltage level is lower than the first average rate of increase to the first level.

16 Claims, 10 Drawing Sheets

(56) References Cited

U.S. PATENT DOCUMENTS

| | | | |
|---|---|---|---|
| 7,558,145 B2* | 7/2009 | Rao et al. | 365/230.05 |
| 7,652,938 B2* | 1/2010 | Tseng | 365/194 |
| 7,911,827 B2* | 3/2011 | Behrends et al. | 365/154 |
| 7,952,955 B2* | 5/2011 | Kodama | 365/230.06 |
| 8,295,099 B1* | 10/2012 | Yachareni et al. | 365/189.04 |
| 2004/0156230 A1* | 8/2004 | Satomi et al. | 365/154 |
| 2011/0007590 A1* | 1/2011 | Katayama | 365/203 |
| 2011/0122712 A1* | 5/2011 | Idgunji et al. | 365/189.11 |

OTHER PUBLICATIONS

H. Pilo et al, "An SRAM Design in 65nm and 45nm Technology Nodes Featuring Read and Write-Assist Circuits to Expand Operating Voltage" *2006 Symposium on VLSI Circuits Digest of Technical Papers*, 2006.

M. Yabuuchi et al, "A 45nm 0.6V Cross-Point 8T SRAM with Negative Biased Read/Write Assist" *2009 Symposium on VLSI Circuits Digest of Technical Papers*, 2009, pp. 158-159.

M.H. Abu-Rahma et al, "A Robust Single Supply Voltage SRAM Read Assist Technique Using Selective Precharge" IEEE, 2008, pp. 234-237.

M. Khellah et al, "Wordline & Bitline Pulsing Schemes for Improving SRAM Cell Stability in Low-Vcc 65nm COS Designs" *2006 Symposium on VLSI Circuits Digest of Technical Papers*, 2006.

K. Takeda et al, "Multi-step Word-line Control Technology in Hierarchical Cell Architecture for Scaled-down High-density SRAMs".

\* cited by examiner writing a zero

IMPROVING READ STABILITY OF A SEMICONDUCTOR MEMORY

BACKGROUND OF THE INVENTION

1. Field of the Invention

The field of the invention relates to the field of data storage and in particular, to the storage and access of data in semiconductor memories.

2. Description of the Prior Art

With ever increasing demands to reduce both the size of devices and their power consumption, it is becoming increasingly challenging to design robust semiconductor memories such as SRAM. Each storage cell in an SRAM comprises a feedback loop for holding a data value. In order to write to the feedback loop and store a new value, the input data value must have a high enough voltage level to be able to switch the state stored by the feedback loop if required, while reading from the feedback loop should be performed without disturbing the values stored in any of the feedback loops. When reading from a cell both bit lines are pre-charged and the side of the cell storing a 0 will pull down the bit line it is connected to and this change in voltage level can be detected to determine where the 0 is stored. However, the difference in voltage levels between the precharged bit line and the 0 may result in the node storing a 0 being pulled up towards 1 resulting in instability in the bit cell and the bit cell flipping value. This is called read disturb and can happen to a cell during a read to a cell or during a write to another cell on the same word line. In the latter case the word line is activated to access the cell being written to, which affects other cells connected to the word line.

As dimensions scale down the variations in device properties due to random dopant fluctuations, line edge roughness etc. increase drastically.

Thus, designing a robust SRAM where cells can be read (without read disturb) and written to across all operational voltage ranges turns out to be very difficult. Reducing the voltage at which the SRAM cells can be read and written to successfully is not easy and in particular as the voltage scales down it becomes increasingly difficult to write to the cells.

It would be desirable to be able to reduce both read and write failures of a semiconductor memory.

SUMMARY OF THE INVENTION

A first aspect of the present invention provides a semiconductor memory storage device for storing digital data comprising one of two digital values a first represented by a predetermined higher voltage level and a second by a predetermined lower voltage level: a plurality of storage cells for storing data each storage cell comprising an access control device for providing said storage cell with access to or isolation from a data access port in response to an access control signal; access control circuitry for transmitting said access control signal along an access control line to control a plurality of said access control devices connected to said access control line; said access control circuitry being responsive to a data access request signal to access a selected storage cell connected to said access control line to transmit said access control signal by increasing a voltage level supplied to said access control line to a first voltage level at a first average rate and then in response to receipt of a further signal to increase said voltage level supplied to said access control line from said first voltage level to said predetermined higher voltage level, wherein a further average rate of increase of said voltage level from said first to said predetermined higher voltage level is lower than said first average rate of increase.

The present invention recognises that when accessing a storage cell the amount of current over a small transition time that results from the storage cell being connected to the data lines via the access control devices can result in charge being injected into the storage cell which can break the stability of the feedback loop. The larger the charge injected, the higher the probability of the storage cell being disturbed and losing its stored value. This problem is addressed by the present invention by providing two signals, a first access control signal causing the voltage supplied to the access control line to rise at first higher rate and a second signal resulting in the rise in voltage level being slowed down. In this way the voltage level transition is controlled and the amount of charge injected into the cell is therefore also controlled. This allows the initial voltage rise to be high so as not to increase unduly access times, while the rise to the predetermined higher voltage level is controlled to limit the charge being injected into the cell and improve stability once the access control device starts to conduct and provide a connection between the data port and the storage cell.

In some embodiments said first voltage level comprises a voltage level substantially equal to a threshold voltage of said access control device.

A particularly effective way of controlling the voltage rise is to allow it to rise fast to the threshold voltage level of the access control device as up to this voltage the storage cell is isolated from the data access port and then to control the voltage rise to be slower from this voltage level to the predetermined high voltage level. In this way the initial rise is fast so that access times are not delayed while the access control device is protecting the storage cell, once the threshold value of this device is reached it starts to turn on and thus, to improve stability of the cell the increase in voltage is controlled to rise at a slower rate thereby limiting charge injection into the cell.

In some embodiments said first voltage level comprises an average threshold voltage level of said plurality of access control devices increased by between 0 and 15% of said average value.

The switch from faster to slower rate may advantageously occur at a point slightly above the threshold voltage of the access control device. At this point the device has started to conduct and delay in it conducting fully allows charge sharing to occur and thus, by the time there is a full connection any voltage difference is reduced.

In some embodiments said access control circuitry comprises a low resistance switch and a higher resistance switch, said access control circuitry being configured to provide said first average rate by connecting said first voltage level to said access control line via said low resistance switch and to provide said further average rate by connecting said access control line to said predetermined higher voltage level via said higher resistance switch and not via said low resistance switch.

Although the change in rate of increase of the voltage level can be achieved in a number of ways, in some embodiments switches with different resistances are used. This is a simple and easy to implement way of providing the desired voltage level of the access control line.

In some embodiments, said access control circuitry further comprises a further low resistance switch, said further low resistance switch being configured to be active in a high performance mode of operation and in said high performance mode of operation to be responsive to said access control signal to connect said access control line to said predetermined higher voltage level via said further low resistance switch.

As noted previously although slowing the rate of rise of the voltage level to the predetermined higher voltage level improves the read disturb margin it does decrease the performance of the memory making it slower to access data. Thus, in some embodiments the memory may be configured to operate in a high performance mode in which the access control line is connected to the higher voltage level in response to the data access request signal. This may be applicable at higher voltage levels of operation where process variations and environmental variations have a smaller influence on stability. In this way a device that can operate in a high performance mode with low access times and a lower performance mode with lower access times but higher read stability, possibly enabling a lower operational voltage to be used is provided.

In some embodiments said data access request comprises a write request and said access control circuitry is responsive to receipt of a further boost control signal to connect said access control line to a boosted voltage level higher than said predetermined higher voltage level, said boosted voltage level facilitating storage of a data value present on said data port in said selected storage cell.

As noted previously the stability of the feedback loop must be high enough to to avoid being disturbed by the access control signal. However, where a value is to be written to a cell, this signal must be able to overwrite the value stored by disturbing the feedback loop. Thus, in some embodiments a boosted voltage level is applied to the access control line to facilitate a write.

In some embodiments said access control circuitry comprises delay control circuitry said delay control circuitry being configured to provide a time delay between said access control line being connected to said predetermined higher voltage level and said access control line being connected to said boosted voltage level said delay control circuitry determining said time delay in dependence upon characteristics of said semiconductor memory storage device.

A side effect of access control line boosting is an increase in the probability of cells that are on the same access control line as the cell being written to having their stored data value corrupted. Where there is a difference in data value between the value on the data line and the value held at a node in a storage cell connected to the data line the difference in voltage between these two points will as noted earlier be at its highest at a beginning of a write cycle. This difference will decrease as the write cycle progresses, and thus, embodiments of the invention recognise that providing a delay to a boost signal boosting a voltage on a data access control line will reduce the maximum voltage difference seen by these two points and thereby reduce the probability of the non-selected cells having their stored values disturbed as the boost will occur when the difference in voltage levels between the stored value and the data line are not at their highest. It should be noted that the difference in voltage level between the data line and the cells not being written to decays over the write cycle as the data line will not be held at the value it has at the beginning of the cycle and thus, this value will change as charge sharing occurs.

A drawback of the delay is that it will increase the write cycle time. The boost to the access line voltage is provided to assist the write, and the sooner it is provided the sooner the write occurs and the less likely it is that the write will not have occurred within the write cycle time. Thus, in prior art systems a boost is generally provided as near to the beginning of the write cycle as possible. However, embodiments of the present invention recognise that by providing delay control circuitry for automatically determining the delay in dependence upon characteristics of the semiconductor memory device, it can provide a suitable delay for the memory concerned.

In some embodiments, said delay control circuitry is configured to generate a delay in dependence upon a target read stability yield of said memory.

Although the delay may be generated depending on a number of factors. As the delay is used to increase read stability, it may be advantageous to determine a target read stability yield of the memory as this is a value that users of the memory find important and then to set the delay dependent on this. Thus, the delay is determined to increase the read stability of the memory device to a required level while still providing an acceptable write time.

In some embodiments, said plurality of storage cells are arranged in at least one array comprising a plurality of rows, a corresponding plurality of access control lines, a plurality of columns and a corresponding plurality of data lines, said delay control circuitry comprising detection circuitry for detecting a number of columns and a number of rows of said memory and for determining said delay in dependence upon said number of columns and said number of rows.

The memory size is the characteristic of the memory that will affect the delay required to generate a target read stability for example. Thus, one of the characteristics that the delay control circuitry may detect and may use in determining the delay is the number of columns and the number of rows of the memory.

In some embodiments, delay control circuitry comprising detection circuitry for tracking process variations in said semiconductor memory storage device and for determining said delay in dependence upon said process variations.

Another characteristic that determines what delay is suitable is the process variations of a memory storage device. Thus, depending on operating conditions and the actual characteristics of that particular memory the delay required for a particular read stability target for example may vary. Thus, detection circuitry that detects these process variations and sets the delay appropriately provides a system where a suitable delay can be automatically provided and the read stability of the device can be increased without unduly affecting the write ability of the cell being written to.

In some embodiments, said semiconductor memory storage device comprises an input port for receiving a user input, said delay control circuitry being responsive to said user input to adjust said delay in dependence upon said user input.

In some embodiments, it may be advantageous to provide a user input that can adjust the delay that is automatically determined. This provides a user with the ability to adjust the performance of the memory as required such that the user can select read stability to be increased or the performance of a write to be increased as the user finds to desirable.

In some embodiments, said semiconductor memory storage device further comprises a dummy data line connected to a column of dummy storage cells, said delay control circuitry being configured in response to said write request to measure a voltage of said dummy data line and in response to said voltage reaching a preset value to trigger said boost to said predetermined voltage level.

One potential way of determining a suitable delay is to have a dummy data line connected to a column of dummy storage cells. The delay control circuitry can then detect when the dummy data line reaches a target value and at this point it can trigger the boost to the predetermined voltage level. The delay in the boost to the predetermined voltage level is provided so that the voltage level difference between the non-selected storage cells and the data lines has fallen before this boost is provided. Thus, one way of determining a suitable point to generate the delay is to detect the voltage level on a dummy data line and when it reaches the required value to trigger the boost. This method would accurately predict a suitable time for this boost to be triggered.

In some embodiments, said plurality of storage cells are arranged in at least one array comprising a plurality of rows, a corresponding plurality of access control lines, a plurality of columns and a corresponding plurality of data lines and complementary data lines, each of said storage cells comprising two access control devices for controlling access to said data line and said complementary data line; wherein in response to said write request said data line and said complimentary data line of said storage cells that are not selected are precharged to said predetermined voltage level and in response to said access control devices providing said storage cell with access to said data line and said complementary data line and in dependence upon a data value stored a voltage level of one of said two data lines starts to fall, said boost to said predetermined voltage being delayed to occur after said voltage level has fallen by a set amount.

In some embodiments the memory storage device may have an array of rows and columns of storage cells with data lines and complimentary data lines such as in a SRAM memory. In such a memory device both the data line and the complimentary data line of cells not being written to are pre-charged before the write request. Thus, one side of the storage cell will have a 0 stored on it and this will be different to the pre-charge value of one of the data lines. Once the data access device starts to conduct, the difference in voltage between the data line and the node of the storage cell storing a 0 will start to fall as the switching device starts to conduct. Determining the fall in the voltage level on the data line is one way of determining a suitable point at which to boost the predetermined voltage level and thereby facilitate a write while reducing the probability of a read disturb occurring on cells on the access control line that are not being written to.

A second aspect of the present invention provides a semiconductor memory storage device comprising: a plurality of storage cells for storing data each storage cell comprising an access control device for providing said storage cell with access to or isolation from a data line in response to an access control signal; access control circuitry for transmitting said access control signal along an access control line to control a plurality of said access control devices connected to said access control line; said access control circuitry being configured in response to a write request to write data to a selected storage cell connected to said access control line to transmit said access control signal by increasing a voltage level supplied to said access control line to a predetermined voltage level such that said access control devices connected said access control line provide their storage cells with access to said data line and after a delay to provide a boost to said predetermined voltage level to facilitate storage of a data value present on said data line in said selected storage cell; said access control circuitry comprising delay control circuitry for automatically determining said delay in dependence upon characteristics of said semiconductor memory device.

The present invention recognises that a side effect of word line boosting is the reduction of the access disturb margin, that is an increase in the probability of cells that are on the same access control line as the cell being written but are not themselves being written having their stored data value corrupted. It also recognises that, where there is a difference in data value between the value on the data line and the value held at a node in a storage cell connected to the data line the difference in voltage between these two points will be at its highest at a beginning of a write cycle. This difference will decrease as the write cycle progresses, and thus, it recognises that providing a delay to a boost signal boosting a voltage on a data access control line will reduce the maximum voltage difference seen by these two points and thereby reduce the probability of the non-selected cells having their stored values disturbed as the boost will occur when the difference in voltage levels between the stored value and the data line are not at their highest. It should be noted that the difference in voltage level between the data line and the cells not being written to will decay over the write cycle as the data line will not be held at the value it has thus, this value will change as charge sharing occurs.

A drawback of the delay is that it will increase the write cycle time. The boost to the access line voltage is provided to assist the write, and the sooner it is provided the sooner the write occurs and the less likely it is that the write will not have occurred within the write cycle time. The present invention recognises that by providing delay control circuitry for automatically determining the delay in dependence upon characteristics of the semiconductor memory device, it can provide a suitable delay to increase the read stability of the memory device to a required level while still providing an acceptable write time.

A third aspect of the present invention provides a method of storing digital data comprising one of two digital values a first represented by a predetermined higher voltage level and a second by a predetermined lower voltage level in a semiconductor memory storage device, comprising the steps of: in response to a data access request signal: connecting an access control line configured to control a plurality of access control devices that provide access to a corresponding plurality of storage cells for storing data to a first voltage level via a low resistance switch, said first voltage level being between said predetermined higher and said predetermined lower voltage levels; in response to a further control signal connecting said access control line to said predetermined higher voltage level that is higher than said first voltage level via a higher resistance switch; such that a voltage level of said access control line rises to said first voltage level at a first average rate of increase and then to said predetermined higher voltage level at a further average rate of increase said first further rate of increase being slower than said first average rate.

A fourth aspect of the present invention provides a method of designing a memory comprising arranging a plurality of storage cells for storing data in an array, each storage cell comprising an access control device for providing said storage cell with access to or isolation from a data line in response to an access control signal, said array comprising at least one data line for each column of said array and an access control line for each row of said array; providing access control circuitry for transmitting said access control signal along a selected one of said access control lines to control a plurality of said access control devices connected to said access control line; configuring said access control circuitry such that in response to a data access request signal to access a selected storage cell connected to said access control line, said access control circuitry transmits said access control signal by increasing a voltage level supplied to said access control line to a first voltage level at a first average rate and then in response to receipt of a further signal said access control circuitry increases said voltage level supplied to said access control line from said first voltage level to said predetermined higher voltage level at a further average rate, wherein a further average rate of increase of said voltage level from said first to said predetermined higher voltage level is lower than said first average rate.

A fifth aspect of the present invention provides a computer program product comprising a computer program which when executed on a computer causes said computer to generate a design for a memory according to a first aspect of the present invention.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1A:
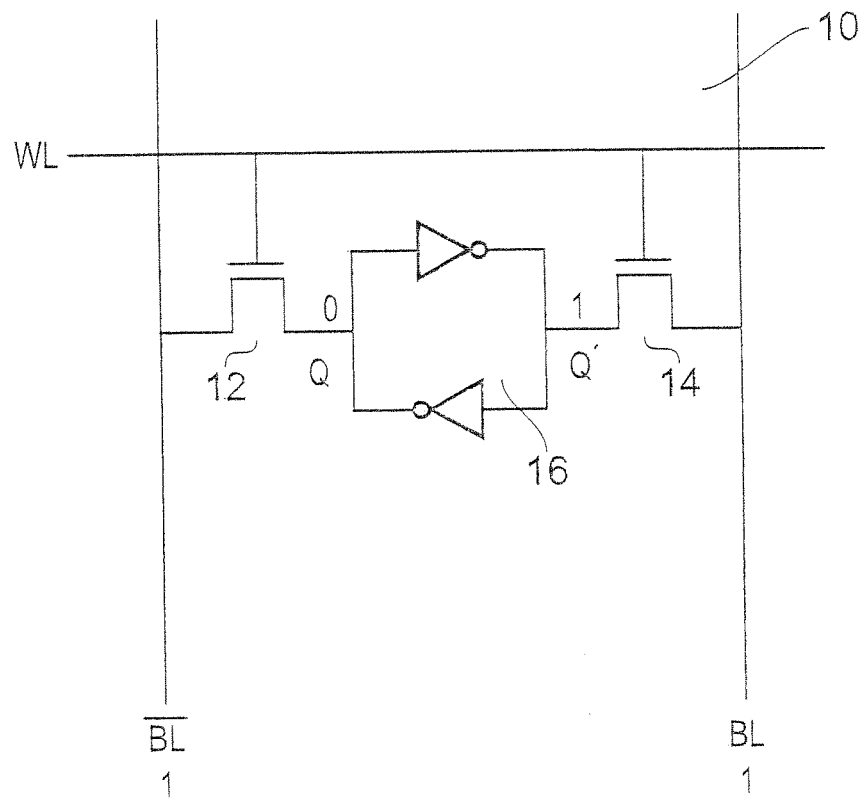
FIG. 1a shows a data storage cell storing a 1 and changes in voltage levels of that data storage cell while a read is being performed according to an embodiment of the present invention.
Figure 1A:
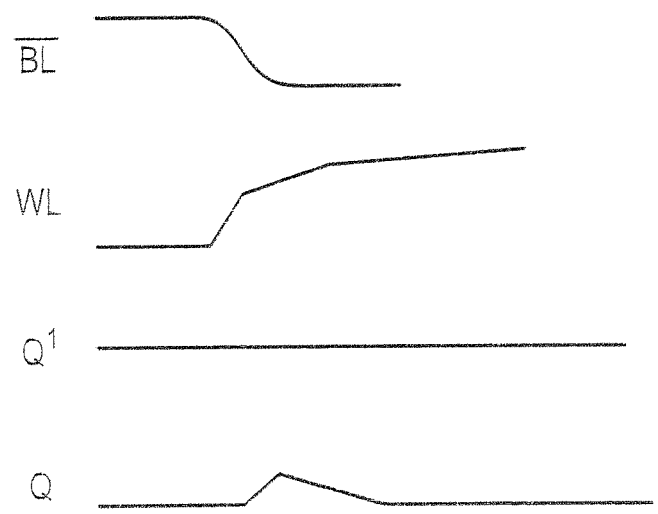

FIG. 1a shows a data storage cell 10 which is a conventional six transistor bit cell of a SRAM memory. This storage cell 10 has access control transistors 12 and 14 which provide access between the cross-coupled inverter storage cell 16 and the bit line BL and the complementary bit line $\overline{BL}$.

These access control devices 12, 14 are controlled by a voltage level on the word line WL. Thus, if access to a row of storage cells 10 within a memory array is requested the voltage level on this word line is increased to a predetermined value corresponding to the high voltage rail of the circuit and the access control devices 12 and 14 which in this embodiment are transistors are turned on. Thus, the two nodes in the storage cell Q and Q' are then connected to the complementary bit line and the bit line respectively.

Prior to the word line voltage level rising the bit line and complementary bit line of cells that are not being written to are pre-charged to hold a 1 level.

In this example data storage cell 10 is storing a 1 which means that the Q' node which is connected to the bit line BL holds a 1 and the other node Q is holding a 0. Thus, when the access control devices 12 and 14 are switched on there is a voltage difference between node Q and the complementary bit line. This will result in some charge sharing thus, the complementary bit line voltage level will gradually fall with time following the word line voltage rising. Similarly, the voltage level at node Q begins to rise initially. However, as the voltage level on the complementary bit line is not being held at this value it will fall and thus, the voltage level at node Q will peak and will then start to come down. In this embodiment the rise in the wordline voltage occurs in two stages. A first faster rise takes the voltage to a level approximately equal to the threshold voltage of the access control devices or pass gates 12 and 14 and thus, at this point they start to turn on. This results in the voltage level at Q starting to rise as charge sharing between the 1 on the complementary bit line and this node occurs. The rise in the word line voltage then continues to rise at a slower rate and thus, as the voltage level on the complementary bit line decreases so the pass gates turn on more fully and the voltage at Q continues to rise for a while and then falls again to 0 as the voltage output on the complementary bit line falls to zero.

Figure 1B:
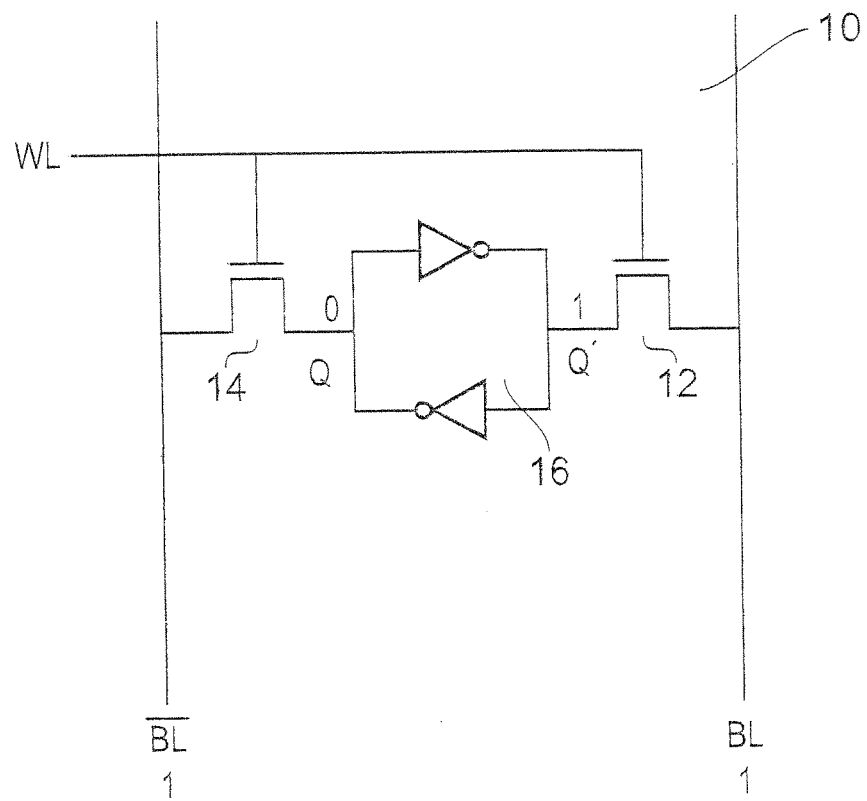
FIG. 1b shows a data storage cell storing a 1 and changes in voltage levels of that data storage cell while a write is being performed to another storage cell in the same row.
Figure 1B:
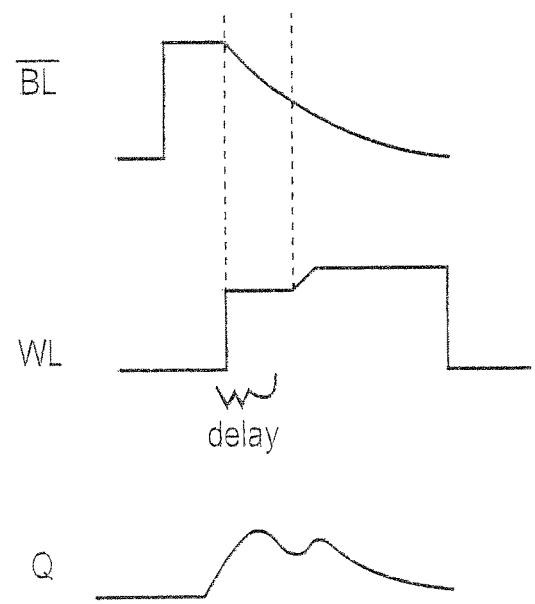

FIG. 1b shows the same storage cell of FIG. 1a but in this embodiment the word line rises directly to the predetermined high level and then after a delay a boost to the word line is provided. This boost is provided to improve the probability of the write being successful, however, it will affect the stability of cells that are on the same word line as the cell being written to but are not themselves being written to.

Thus, in this example as in the example of FIG. 1a, the bit line and complementary bit line are precharged to 1. The voltage on the word line then rises to the high voltage rail level and after a delay a boost to that level is provided. By delaying the boost until the voltage level at node Q is beyond its peak then the increase in voltage level that occurs due to the boost on the word line voltage will occur after the peak in the voltage difference between the complementary bit line and Q and thus, will have less effect than if it occurred at the peak and will be less likely to cause the cell to flip its stored value. The storage cell 16 is a storage cell with a cross-coupled inverter and it has two stable states. If the voltage level at node Q rises too high then the states may switch so that the other stable state is attained and Q rises to hold a voltage level 1 and Q' to hold a voltage level 0. This is equivalent of the data storage cell storing a 0. Thus, if one does not wish to disturb the value stored within the data storage cell it is important that the voltage at Q does not rise too high so that the probability of this undesired switch in stable states by storage cell 16 is low.

It should be noted that to improve read stability still further the initial rise to the high voltage non-boosted level could be done in a delayed two ramp style such as is shown in FIG. 1a. There could then be a further delay until the boost to the word line is provided.

Figure 1C:
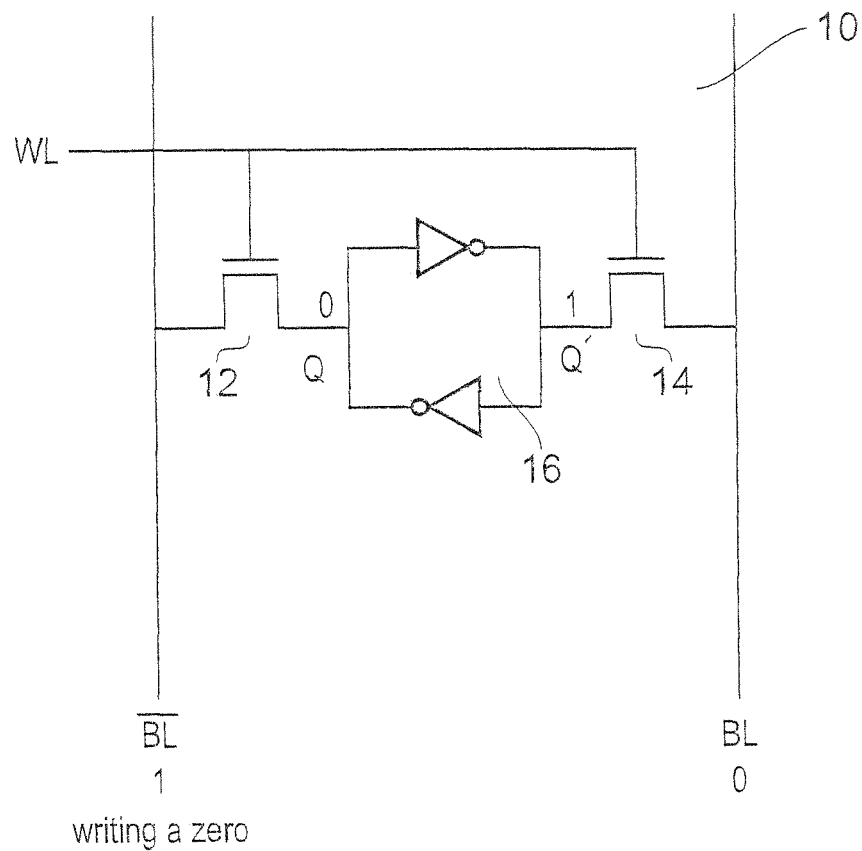
FIG. 1c shows a data storage cell storing a 1 and voltage levels changing within that storage cell while a 0 is being written to it.
Figure 1C:
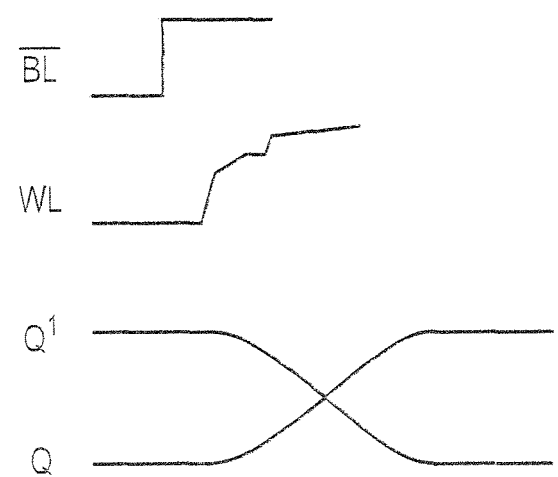

FIG. 1c shows the same data storage cell 10 that is currently storing a 1 and to which a 0 is being written. If a 0 is being written then the bit line is held at a 0 value and the complimentary bit line is pre-charged to 1. When the word line is triggered then nodes Q and Q' are connected to their respective bit lines and as there is a difference in voltage between both the nodes and their respective bit lines the voltage levels start to change. Thus, the voltage level at Q will start to rise while the voltage level at Q' will start to fall.

In this example, the word line rise to the predetermined high voltage level occurs in the slowed two ramp form, and the boost to the word line occurs with a slight delay after that. The boost to the word line helps trigger the switch in stable states of storage cell 16 and thus, the storage cell will switch from one stable state where Q holds a 0 and Q' a 1 to the other stable state where Q holds a 1 and Q' holds a 0. In this way, a 0 is written successfully to data storage cell 10.

Figure 2:
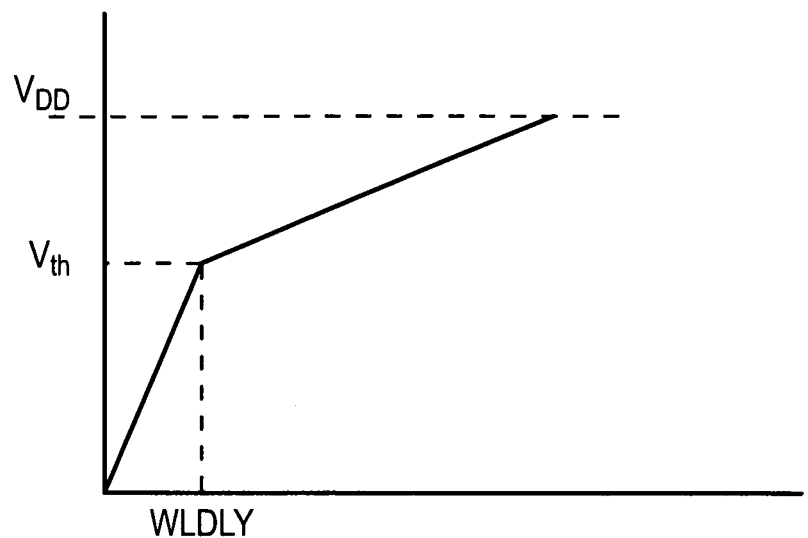
FIG. 2 shows a rate of change of voltage on a word line.

FIG. 2 shows the voltage level rise on the word line in response to a data access request according to an embodiment of the present invention. The voltage level rises at a first higher rate to a level approximately equal to the threshold voltage of the pass gates of the storage cells. Thus, at this voltage they start to turn on. A control signal WL_DLY is then used to slow the voltage rise so that there is some charge sharing between the nodes of the storage cell and the bit lines before the pass gates are fully on. This helps prevent the cell from switching states when it is not being written to.

Figure 3:
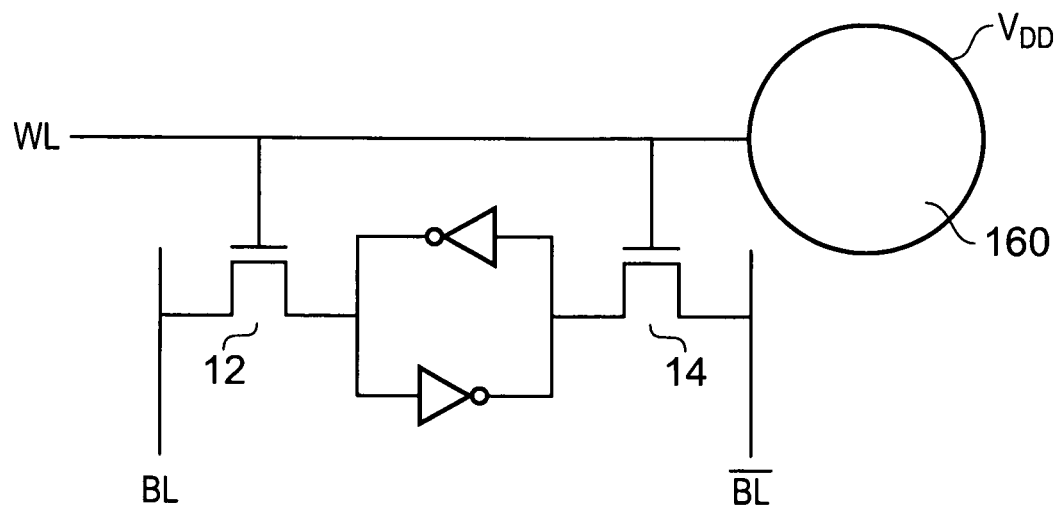
FIG. 3 shows a storage cell, word line and access control circuitry.

FIG. 3 shows the storage cell with pass gates 12 and 14 which are controlled by the voltage level on the word line WL of FIG. 2. The word line is connected to the high voltage level VDD by access control circuitry comprising switching circuitry 160.

Figure 4:
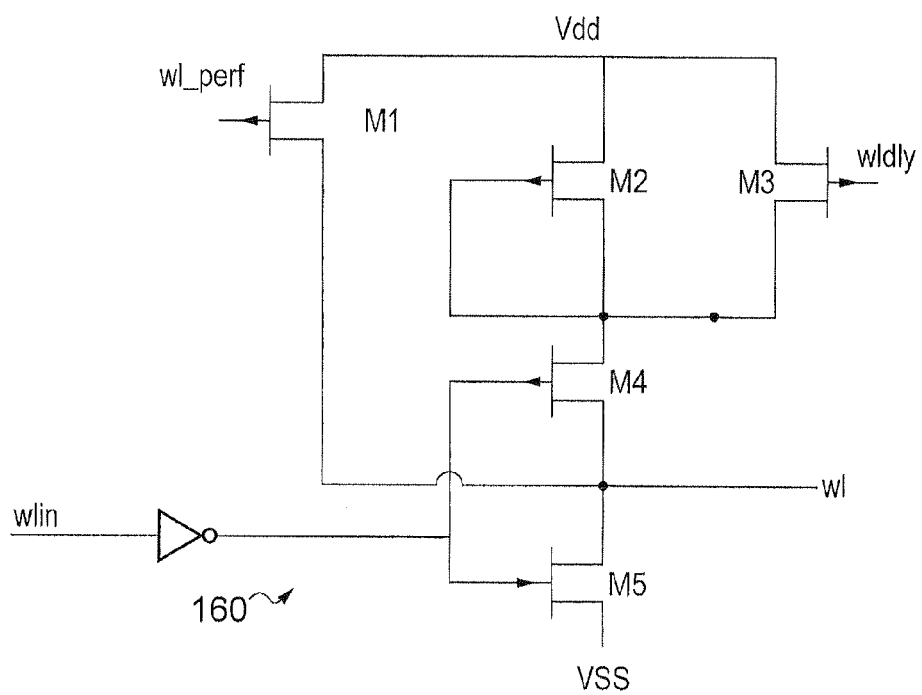
FIG. 4 shows access control circuitry for generating the modified ramp in the voltage level increase on the word line according to an embodiment of the present invention.

FIG. 4 shows access control circuitry comprising the switching circuitry 160 of FIG. 3. This circuitry has three control signal inputs. WL_PERF is an input used in a high performance mode and is used to connect the word line via low resistance switch M1 to the high voltage rail VDD and thereby control a fast voltage rise of the word line directly to VDD in this high performance mode. This enables fast access to the storage cell, but has an associated risk of causing read disturbs to occur.

Wlin is the access control signal that indicates a data access is requested. This signal turns on the diode connected pmos transistor M2 and turns off transistor M5 which when on pulls the word line WL to VSS and also turns on transistor switch M4 such that the voltage level on the word line is pulled up to VDD−Vt, Vt being the voltage across the reverse biased diode and being selected so that VDD−Vt is slightly more than the threshold voltage of the pass gates of the storage cell, so that the pass gates are just turned on. A further control signal Wldly is then input to the switching circuitry 160 and this turns transistor M3 on. M3 is a weak high resistance transistor and thus, the voltage rise on the word line is slowed down. The strength of the transistor M3 is selected to provide a desired slow voltage rise from VDD−Vt to VDD to decrease the amount of charge injection into the cell. In this way the rate of change of voltage of a node Q or Q' in the storage cell is reduced so that the peak value is also reduced along with the chances of an undesired switch occurring.

Figure 5:
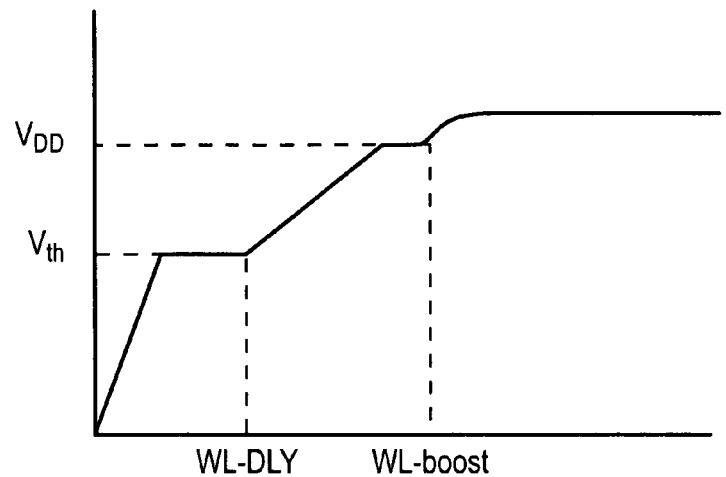
FIG. 5 shows a rate of change of a voltage level on a word line.
Figure 6:
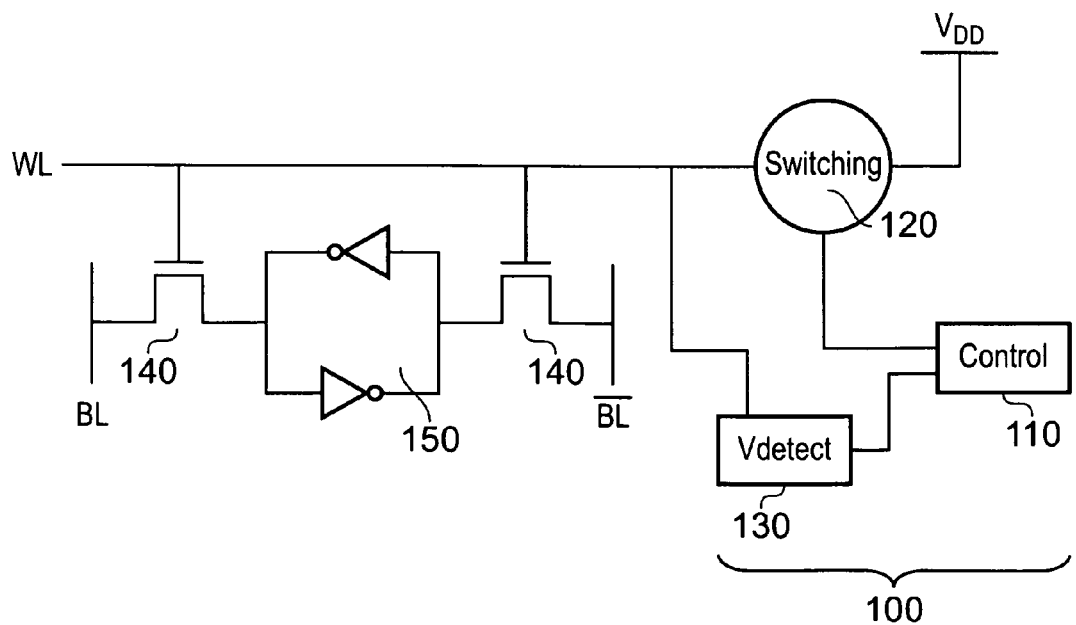
FIG. 6 shows a data storage cell and access control circuitry according to an embodiment of the present invention.

FIG. 5 shows a change in voltage on a word line of a circuit shown in FIG. 6.

FIG. 6 shows a bit cell 150 for storing a data value connected via pass gate 140 to a word line WL. The voltage level of the word line is controlled by control circuitry 100. Control circuitry 100 comprises control logic 110, switching circuitry 120 and a voltage level detector 130.

In response to a data access request control logic 110 instructs switching circuitry 120 to connect to a first intermediate voltage level Vth via a low resistance switch and the voltage level of the word line rises rapidly to this intermediate voltage level. Voltage detector 130 detects this voltage level rise and after a predetermined time delay it sends a signal to control circuitry 110 which in turn sends a control signal WL_DLY to switching circuitry 120 that connects VDD to the word line via a higher resistance switch such that the voltage rise from the intermediate voltage level Vth to VDD is slower than the initial rise to Vth.

If the data access request was a write request, the control circuitry is responsive to detection from the voltage detector 130 that the word line voltage level has reached VDD to wait for a predetermined delay and then to apply a boost WL-boost to the word line voltage. The time delay that the control circuitry uses before applying the boost is determined from the characteristics of the memory device that may be detected by detection circuitry such as that shown in FIG. 7. Furthermore, the delay applied before transmitting the WL_DLY signal may also be determined from such circuitry, alternatively, the signal may be sent in response to detecting the voltage level on the word line reaching the intermediate voltage.

Figure 7:
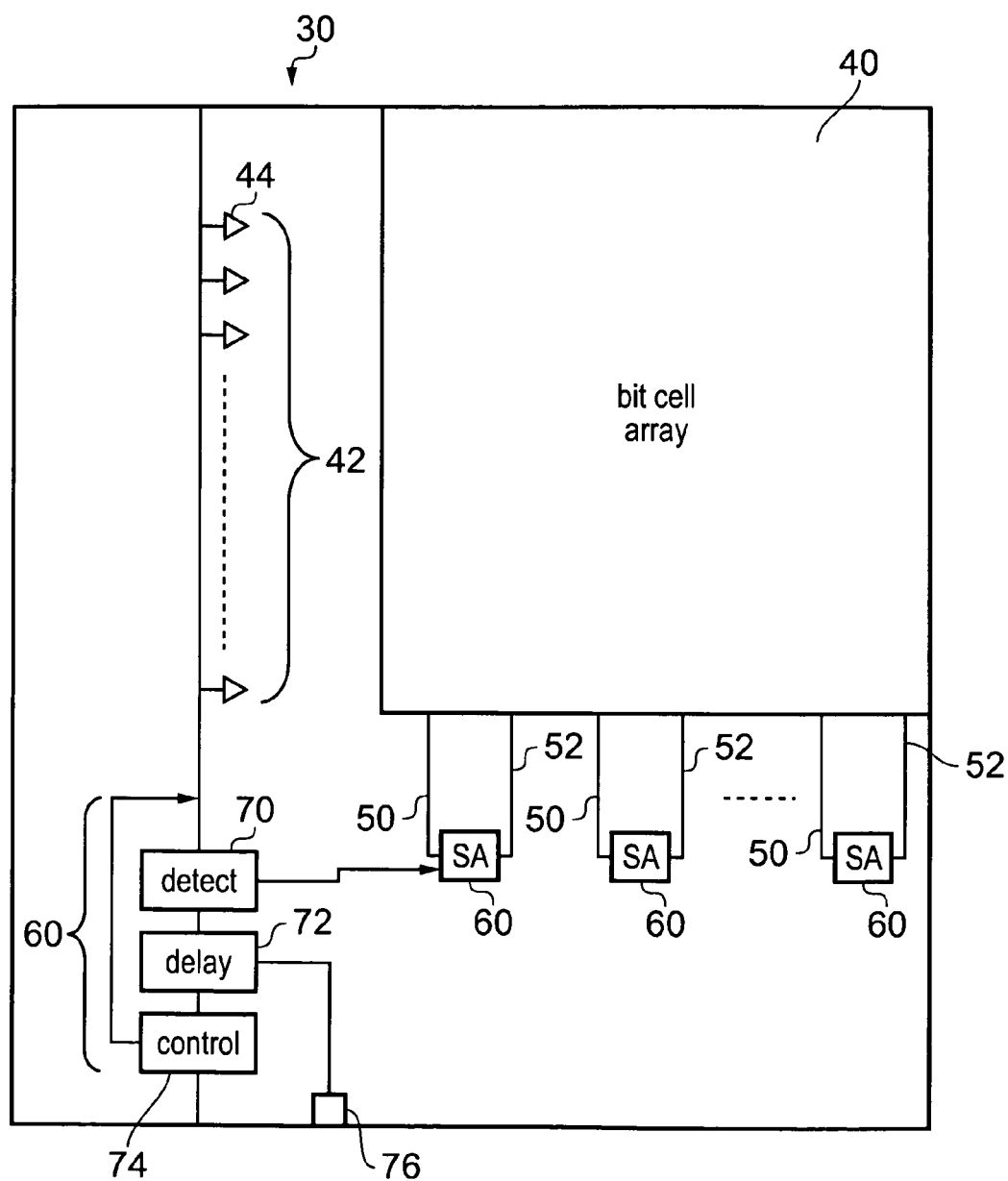
FIG. 7 shows a semiconductor memory storage device according to an embodiment of the current invention.

FIG. 7 shows a semiconductor memory storage device 30 according to an embodiment of the present invention. It comprises a bit cell array 40 with a plurality of columns and a plurality of rows of storage cells. These are accessed by word lines 42 which have word line drivers 44 on them which are used to drive the voltage level of the world line high when a data access to that particular row of storage cells is required. They also have bit lines and complementary bit lines 50 and 52 for each column of storage cells and these are also driven high and low as required by circuitry not shown. A difference in value between the voltage level of the bit line and the complementary bit line is detected using sense amplifiers 60.

The memory storage device 30 also comprises access control circuitry 60 which is used to generate the signals required to access the various bit cells in the bit cell array 40. Access control circuitry comprises detection circuitry 70 that is used to detect in this embodiment the number of rows and the number of columns present in the bit cell array. This in turn is used to determine suitable timings for the various pulses and in particular a suitable delay for the boost value to be applied to the word line.

Thus, delay determination circuitry 72 receives information from detection circuitry 70 and sets a suitable delay to occur between the word line for a particular row being asserted and the boost to the voltage level being applied. This is controlled by control circuitry 74 which receives information from the delay circuitry and controls the word line drivers 44 to be asserted at a certain point and to provide a boost to the voltage level at a suitable delay thereafter. The circuitry may also be used to set the timing for the WL_DLY signal that connects VDD to the word line and starts the rise in voltage from the intermediate voltage level to VDD of the word line.

In this embodiment there is also a user input port 76 which allows a user to adjust the delay provided by delay circuitry 72 and increase or decrease it as the user requires. Thus, a user may decide that the read stability yield of the memory is higher than required and the user would prefer memory to have higher performance and thus, in this embodiment a user can at this point insert a value which indicates to the delay control circuitry 72 that it should reduce the delay by a certain amount. Alternatively, the user may require a higher read stability yield and thus, may provide data to the delay control circuitry 72 via user input 76 which indicates that the delay should be increased.

Although in this embodiment the detection circuitry 70 is used specifically to detect the size of the bit cell array, it can also be used to detect other characteristics of the bit cell array such as tracking the process variations in the bit cell array such that the performance of a particular bit cell array can be determined and a suitable delay for that bit cell array calculated.

It should be noted that such things as process variations of the individual cells of the bit cell array are important in determining the delay as it is the worse performing cell that is important when considering the yield of the memory and in a large array this is the cell that is furthest from the word line drivers for example and thus, receives the signal later than cells closer to the word line drivers.

Figure 8:
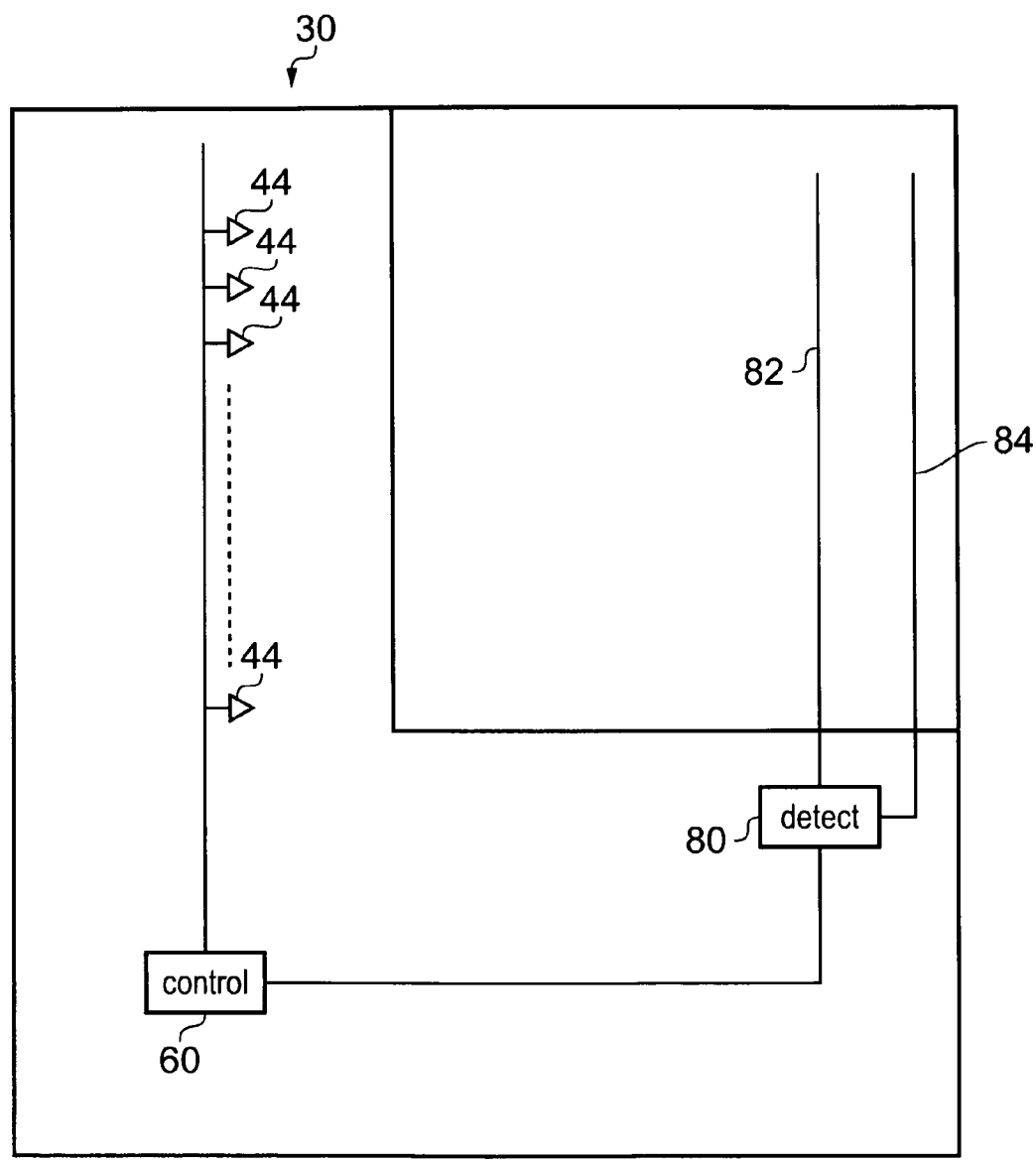
FIG. 8 shows a semiconductor memory storage device having a dummy data line according to an embodiment of the present invention.

FIG. 8 shows an alternative embodiment of the semiconductors memory cell 30 in which the access control circuitry 60 uses detection circuitry 80 and dummy data lines 82 and 84 which are linked to dummy storage cells not shown to determine a suitable point to trigger the boost to the word line voltage applied by the word line drivers 44.

As noted previously, it is the difference in voltage between the pre-charged bit lines and complementary bit lines and the nodes within the cell which is important in to determining when the boost should be applied to meet the required read stability. Thus, detecting the voltage levels on these bit lines is a convenient way of determining when they have reached a desired value and thus, when it is appropriate to apply the boost to the word line voltage. Providing dummy data lines and dummy storage cells that mirror the performance of the bit cell array provides this information in a convenient form which the control circuitry can use to trigger the boost in the word line voltage at the correct point.

Figure 9:
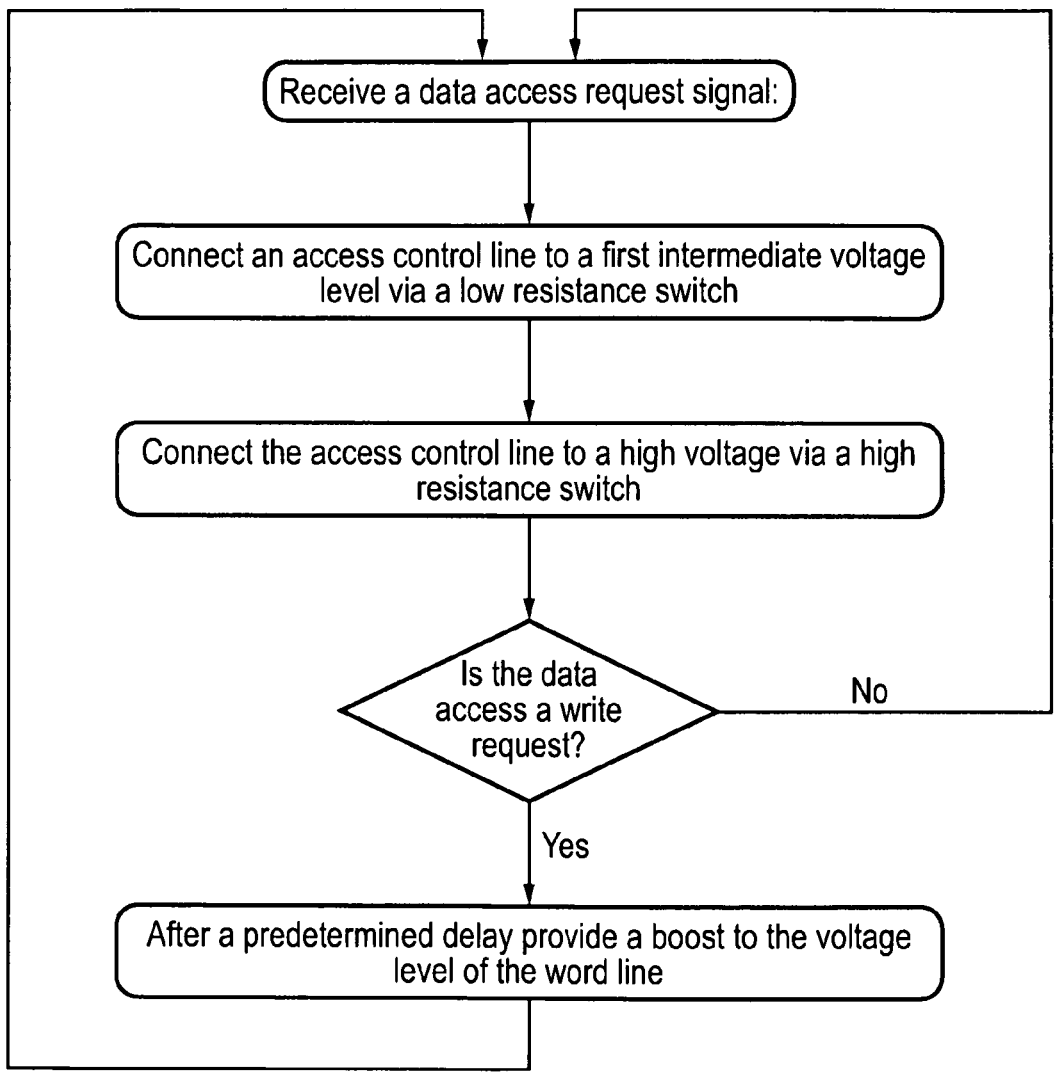
FIG. 9 shows a flow diagram illustrating a method of accessing data according to an embodiment of the present invention.

FIG. 9 shows a flow diagram illustrating steps in a method of accessing a memory according to an embodiment of the present invention. In response to a data access request, an access control line (the word line of the previous figures) is connected to a first intermediate voltage level via a low resistance switch. Thus, the access control line's voltage rises quickly to this first intermediate voltage level. This level is generally the threshold voltage level of the pass gates of the storage cells. The access control line is then connected to the high voltage level of the circuit via a higher resistance switch such that the voltage level rise on the word line to this level is slower. This limits the charge injection into the cell and helps the stability of the cell.

It is then determined if the access request is a write request or not. If it is then a boost is provided to the word line voltage after a predetermined delay, if not then this access request is finished.

Figure 10:
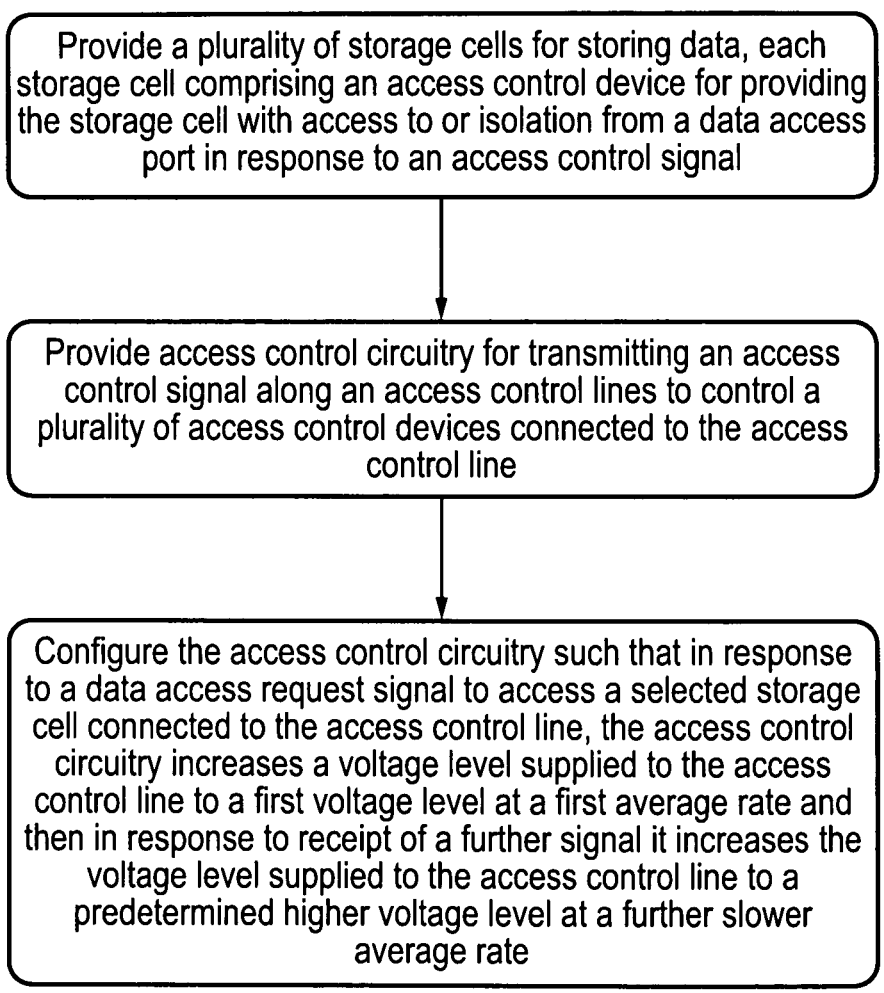
FIG. 10 shows a flow diagram illustrating steps in a method of designing a memory according to an embodiment of the present invention.

FIG. 10 shows a method of designing a memory according to an embodiment of the present invention. It should be noted that although the memory hardware has been illustrated in these figures, the design of this hardware may be implemented as steps in a computer program. In this regard a piece of software can be used to generate a memory with specific characteristics as desired by a user, and with the features of controllable voltage level rises on the word line of embodiments of the present invention.

Thus in this method a plurality of storage cells are provided each storage cell comprising an access control device for providing the storage cell with access to or isolation from a data access port in response to an access control signal. These may be provided in the form of an array. Access control circuitry for transmitting an access control signal along an access control line to control a plurality of access control devices connected to the access control line is then provided.

This access control circuitry is configured such that in response to a data access request signal to access a selected storage cell connected to the access control line, the access control circuitry increases a voltage level supplied to the access control line to a first voltage level at a first average rate and then in response to receipt of a further signal it increases the voltage level supplied to the access control line to a predetermined higher voltage level at a further slower average rate. In this way the voltage level rises quickly to a first value and then more slowly. This allows the actual connection of the storage cell to the data port to be controlled, so that charge injection into the cell is also controlled and undesired switching of the stored value is reduced.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. A semiconductor memory storage device for storing digital data comprising one of two digital values a first digital value represented by a predetermined higher voltage level and a second digital value by a predetermined lower voltage level:
   a plurality of storage cells for storing data each storage cell comprising an access control device for providing a corresponding storage cell with access to or isolation from a data access port in response to an access control signal;
   access control circuitry for transmitting said access control signal along an access control line to control each of said access control devices connected to said access control line;
   said access control circuitry being responsive to a data access request signal to access a selected storage cell connected to said access control line to transmit said access control signal by increasing a voltage level supplied to said access control line to a first voltage level at a first average rate and then in response to receipt of a further signal to increase said voltage level supplied to said access control line from said first voltage level to said predetermined higher voltage level, wherein a further average rate of increase of said voltage level from said first to said predetermined higher voltage level is lower than said first average rate of increase, wherein said access control circuitry comprises a low resistance switch and a higher resistance switch, said access control circuitry being configured to provide said first average rate by connecting said first voltage level to said access control line via said low resistance switch and to provide said further average rate by connecting said access control line to said predetermined higher voltage level via said higher resistance switch and not via said low resistance switch, wherein said data access request signal comprises a write request and said access control circuitry is responsive to receipt of a further boost control signal to connect said access control line to a boosted voltage level higher than said predetermined higher voltage level, said boosted voltage level facilitating storage of a data value present on said data access port in said selected storage cell.

2. A semiconductor memory storage device according to claim 1, wherein said first voltage level comprises a voltage level substantially equal to a threshold voltage of said access control device.

3. A semiconductor memory storage device according to claim 1, comprising a further low resistance switch, said further low resistance switch being configured to be active in a high performance mode of operation and in said high performance mode of operation to be responsive to said access control signal to connect said access control line to said predetermined higher voltage level via said further low resistance switch.

4. A semiconductor memory storage device according to claim 1,
wherein said access control circuitry comprises delay control circuitry said delay control circuitry being configured to provide a time delay between said access control line being connected to said predetermined higher voltage level and said access control line being connected to said boosted voltage level said delay control circuitry determining said time delay in dependence upon characteristics of said semiconductor memory storage device.

5. A semiconductor memory storage device according to claim 4, said delay control circuitry being configured to generate a delay in dependence upon a target read stability yield of said memory.

6. A semiconductor memory storage device for storing digital data comprising one of two digital values a first digital value represented by a predetermined higher voltage level and a second digital value by a predetermined lower voltage level:
a plurality of storage cells for storing data each storage cell comprising an access control device for providing said storage cell with access to or isolation from a data access port in response to an access control signal;
access control circuitry for transmitting said access control signal along an access control line to control a plurality of said access control devices connected to said access control line;
said access control circuitry being responsive to a data access request signal to access a selected storage cell connected to said access control line to transmit said access control signal by increasing a voltage level supplied to said access control line to a first voltage level at a first average rate and then in response to receipt of a further signal to increase said voltage level supplied to said access control line from said first voltage level to said predetermined higher voltage level, wherein a further average rate of increase of said voltage level from said first to said predetermined higher voltage level is lower than said first average rate of increase,
wherein said data access request comprises a write request and said access control circuitry is responsive to receipt of a further boost control signal to connect said access control line to a boosted voltage level higher than said predetermined higher voltage level, said boosted voltage level facilitating storage of a data value present on said data access port in said selected storage cell,
wherein said access control circuitry comprises delay control circuitry said delay control circuitry being configured to provide a time delay between said access control line being connected to said predetermined higher voltage level and said access control line being connected to said boosted voltage level said delay control circuitry determining said time delay in dependence upon characteristics of said semiconductor memory storage device,
wherein said plurality of storage cells are arranged in at least one array comprising a plurality of rows, a corresponding plurality of access control lines, a plurality of columns and a corresponding plurality of data ports, said delay control circuitry comprising detection circuitry for detecting a number of columns and a number of rows of said memory storage device and for determining said time delay in dependence upon said number of columns and said number of rows.

7. A semiconductor memory storage device for storing digital data comprising one of two digital values a first digital value represented by a predetermined higher voltage level and a second digital value by a predetermined lower voltage level:
a plurality of storage cells for storing data each storage cell comprising an access control device for providing said storage cell with access to or isolation from a data access port in response to an access control signal;
access control circuitry for transmitting said access control signal along an access control line to control a plurality of said access control devices connected to said access control line;
said access control circuitry being responsive to a data access request signal to access a selected storage cell connected to said access control line to transmit said access control signal by increasing a voltage level supplied to said access control line to a first voltage level at a first average rate and then in response to receipt of a further signal to increase said voltage level supplied to said access control line from said first voltage level to said predetermined higher voltage level, wherein a further average rate of increase of said voltage level from said first to said predetermined higher voltage level is lower than said first average rate of increase,
wherein said data access request comprises a write request and said access control circuitry is responsive to receipt of a further boost control signal to connect said access control line to a boosted voltage level higher than said predetermined higher voltage level, said boosted voltage level facilitating storage of a data value present on said data access port in said selected storage cell,
wherein said access control circuitry comprises delay control circuitry said delay control circuitry being configured to provide a time delay between said access control line being connected to said predetermined higher voltage level and said access control line being connected to said boosted voltage level said delay control circuitry determining said time delay in dependence upon characteristics of said semiconductor memory storage device,
wherein said delay control circuitry comprises detection circuitry for tracking process variations in said semiconductor memory storage device and for determining said time delay in dependence upon said detected process variations.

8. A semiconductor memory storage device according to claim 4, said semiconductor memory storage device comprising an input port for receiving a user input, said delay control circuitry being responsive to said user input to adjust said delay in dependence upon said user input.

9. A semiconductor memory storage device according to claim 8, wherein said user input comprises an adjustment to a target read stability yield.

10. A semiconductor memory storage device for storing digital data comprising one of two digital values a first digital value represented by a predetermined higher voltage level and a second digital value by a predetermined lower voltage level:
a plurality of storage cells for storing data each storage cell comprising an access control device for providing said storage cell with access to or isolation from a data access port in response to an access control signal;
access control circuitry for transmitting said access control signal along an access control line to control a plurality of said access control devices connected to said access control line;
said access control circuitry being responsive to a data access request signal to access a selected storage cell connected to said access control line to transmit said access control signal by increasing a voltage level supplied to said access control line to a first voltage level at a first average rate and then in response to receipt of a further signal to increase said voltage level supplied to said access control line from said first voltage level to said predetermined higher voltage level, wherein a further average rate of increase of said voltage level from said first to said predetermined higher voltage level is lower than said first average rate of increase, wherein said data access request comprises a write request and said access control circuitry is responsive to receipt of a further boost control signal to connect said access control line to a boosted voltage level higher than said predetermined higher voltage level, said boosted voltage level facilitating storage of a data value present on said data access port in said selected storage cell, said semiconductor memory storage device further comprising a dummy data line connected to a column of dummy storage cells, said delay control circuitry being configured in response to said data access request to measure a voltage of said dummy data line and in response to said voltage reaching a preset value to trigger a boost to said predetermined higher voltage level.

11. A semiconductor memory storage device for storing digital data comprising one of two digital values a first digital value represented by a predetermined higher voltage level and a second digital value by a predetermined lower voltage level:
- a plurality of storage cells for storing data each storage cell comprising an access control device for providing said storage cell with access to or isolation from a data access port in response to an access control signal;
- access control circuitry for transmitting said access control signal along an access control line to control a plurality of said access control devices connected to said access control line;
- said access control circuitry being responsive to a data access request signal to access a selected storage cell connected to said access control line to transmit said access control signal by increasing a voltage level supplied to said access control line to a first voltage level at a first average rate and then in response to receipt of a further signal to increase said voltage level supplied to said access control line from said first voltage level to said predetermined higher voltage level, wherein a further average rate of increase of said voltage level from said first to said predetermined higher voltage level is lower than said first average rate of increase,
- wherein said data access request comprises a write request and said access control circuitry is responsive to receipt of a further boost control signal to connect said access control line to a boosted voltage level higher than said predetermined higher voltage level, said boosted voltage level facilitating storage of a data value present on said data access port in said selected storage cell,
- wherein said plurality of storage cells are arranged in at least one array comprising a plurality of rows, a corresponding plurality of access control lines, a plurality of columns and a corresponding plurality of data lines and complementary data lines, each of said storage cells comprising two access control devices, one of said two access control devices for controlling access to one of said plurality of data lines and the other of said two access control devices for controlling access to one of said plurality of complementary data lines; wherein
- in response to said write request, said plurality of data lines and said plurality of complimentary data lines of said plurality of storage cells that are not selected are precharged to said predetermined higher voltage level and in response to said access control devices providing said plurality of storage cells in one of said plurality of rows with access to said plurality of data lines and said plurality of complementary data lines and in dependence upon a data value stored, a voltage level of one of said plurality of data lines or said one of said plurality of complementary data lines starts to fall a boost to said predetermined higher voltage level being delayed to occur after said voltage level has fallen by a set amount, said set amount determined by delay control circuitry.

12. A method of storing digital data comprising one of two digital values a first digital value represented by a predetermined higher voltage level and a second digital value represented by a predetermined lower voltage level in a semiconductor memory storage device, comprising the steps of:
in response to a data access request signal:
- connecting an access control line configured to control a plurality of access control devices that provide access to a corresponding plurality of storage cells for storing data to a first voltage level via a low resistance switch, said first voltage level being between said predetermined higher voltage level and said predetermined lower voltage level;
- in response to a further control signal connecting said access control line to said predetermined higher voltage level that is higher than said first voltage level via a higher resistance switch; such that
a voltage level of said access control line rises to said first voltage level at a first average rate of increase and then to said predetermined higher voltage level at a further average rate of increase said first further rate of increase being slower than said first average rate, wherein
said data access request signal comprises a write request and said method including the further step of connecting, in response to receiving a further boost control signal, said access control line to a boosted voltage level higher than said predetermined higher voltage level, said boosted voltage level facilitating storage of a data value present on a data access port in a selected storage cell.

13. A method of designing a memory comprising arranging a plurality of storage cells for storing data in an array comprising a plurality of columns and a plurality of rows, each storage cell comprising an access control device for providing a corresponding storage cell with access to or isolation from a data line in response to an access control signal, said array comprising at least one data line for each of said plurality of columns of said array and an access control line for each of said plurality of rows of said array;
- providing access control circuitry for transmitting said access control signal along a selected one of said access control lines to control each of said access control devices connected to said access control line;
- configuring said access control circuitry such that in response to a data access request signal to access a selected storage cell connected to said access control line, said access control circuitry transmits said access control signal by connecting a first voltage level to said access control line via a low resistance switch thereby increasing a voltage level supplied to said access control line to said first voltage level at a first average rate and then in response to receipt of a further signal said access control circuitry increases said voltage level supplied to said access control line from said first voltage level to a predetermined higher voltage level at a further average rate by connecting said access control line to said predetermined higher voltage level via a higher resistance switch such that a further average rate of increase of said voltage level from said first to said predetermined higher voltage level is lower than said first average rate, wherein said data access request signal comprises a write request and said access control circuitry is configured, responsive to receipt of a further boost control signal, to connect said access control line to a boosted voltage level higher than said predetermined higher voltage level, said boosted voltage level facilitating storage of a data value present on a data access port in said selected storage cell.

14. A computer program product comprising a non-transitory computer readable storage medium storing a computer program which when executed on a computer causes said computer to generate a design for a memory according to claim 1.

15. A semiconductor memory storage device according to claim 1, wherein said predetermined higher voltage is a voltage level of a high voltage rail connected to said semiconductor memory storage device.

16. A semiconductor memory storage device according to claim 15, wherein said access control circuitry comprises a diode configured to provide a resistive path to said high voltage rail when reverse biased such that said access control circuitry supplies said first voltage level to said access control line.

* * * * *